United States Patent
Garcia-Flores

(10) Patent No.: US 9,308,826 B2
(45) Date of Patent: Apr. 12, 2016

(54) METHOD AND APPARATUS TO DETECT LEAKAGE CURRENT BETWEEN POWER SOURCES

(71) Applicant: Continental Automotive Systems, Inc., Auburn Hills, MI (US)

(72) Inventor: Juan Carlos Garcia-Flores, Southfield, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 119 days.

(21) Appl. No.: 14/134,555

(22) Filed: Dec. 19, 2013

(65) Prior Publication Data

US 2015/0175027 A1     Jun. 25, 2015

(51) Int. Cl.
G01N 27/416      (2006.01)
B60L 11/18       (2006.01)
G01R 31/36       (2006.01)
B60L 3/00        (2006.01)

(52) U.S. Cl.
CPC ........... *B60L 11/1851* (2013.01); *B60L 3/0069* (2013.01); *B60L 11/18* (2013.01); *B60L 11/1868* (2013.01); *G01R 31/3631* (2013.01); *G01R 31/3648* (2013.01)

(58) Field of Classification Search
CPC ........... G01R 31/3648; G01R 31/3627; G01R 31/3662; G01R 31/3631; Y02E 60/12
USPC ........................................................ 324/426
See application file for complete search history.

(56) References Cited

U.S. PATENT DOCUMENTS

| | | | | |
|---|---|---|---|---|
| 4,489,370 A * | 12/1984 | Migliori | ................. | H02M 1/40 363/134 |
| 7,759,903 B2 * | 7/2010 | Kamata | ................. | G01R 31/362 320/132 |
| 8,144,024 B2 * | 3/2012 | Akimov | ................. | G01R 31/025 320/128 |
| 8,598,847 B2 * | 12/2013 | Eberhard | ................ | H02J 7/0016 320/126 |
| 2003/0015995 A1 * | 1/2003 | Tamura | ................. | H02J 7/0026 320/162 |
| 2003/0137319 A1 * | 7/2003 | Furukawa | ............. | B60L 3/0023 324/426 |
| 2006/0012336 A1 * | 1/2006 | Fujita | .................... | H02J 7/0021 320/119 |
| 2010/0156426 A1 * | 6/2010 | Kang | .................... | G01R 31/025 324/444 |
| 2010/0237872 A1 | 9/2010 | Kang et al. | | |
| 2010/0271052 A1 * | 10/2010 | Ishikawa | .............. | G01R 31/026 324/686 |
| 2012/0043967 A1 * | 2/2012 | Miura | ................... | B60L 3/0069 324/426 |
| 2012/0112755 A1 * | 5/2012 | Nishizawa | ........... | G01R 31/362 324/433 |
| 2012/0194199 A1 * | 8/2012 | Mizoguchi | ......... | G01R 31/3658 324/433 |
| 2013/0300430 A1 | 11/2013 | Lindsay et al. | | |
| 2014/0095093 A1 * | 4/2014 | Hong | ..................... | G01R 31/02 702/63 |

OTHER PUBLICATIONS

European Patent Office Search Report dated Nov. 24, 2015.
Leakage Measurement Circuit, BECM 2012, May 5, 2012.

\* cited by examiner

*Primary Examiner* — Arun Williams

(57) ABSTRACT

Leakage current between two electrical energy sources in a vehicle, one of which is normally isolated from ground, can be detected and measured by connecting voltage dividers across the two sources. The center node voltage of the first voltage divider, connected across a first battery, is measured. Thereafter, the center nodes of both dividers are connected to each other and the center node voltage of both dividers is measured and compared to the first voltage obtained from the first divider. A difference between the two voltages indicates a leakage current from the second battery to ground.

15 Claims, 4 Drawing Sheets

METHOD AND APPARATUS TO DETECT LEAKAGE CURRENT BETWEEN POWER SOURCES

BACKGROUND

Many hybrid motor vehicles use two different batteries. One provides vehicle accessory power, and the other provides power to a drive motor. Such batteries are often isolated from each other electrically. A high-voltage battery can also be isolated from the vehicle's chassis or reference potential.

When wiring from the high voltage battery for the drive motor is routed throughout the vehicle, physical damage to the conductors that extend between the battery and the drive motor can frequently cause leakage current to flow between that battery and the vehicle's primary battery. A leakage current can also exist when connections between individual cells comprising a high-voltage battery are shorted to ground. A method and an apparatus for detecting and quantifying a leakage current flowing between two normally disconnected batteries would be an improvement over the prior art.

BRIEF SUMMARY

In accordance with embodiments of the invention, leakage current between two electrical energy sources in a vehicle, one of which is normally isolated from ground, can be detected and measured by connecting voltage dividers across the two sources. The center node voltage of the first voltage divider, connected across a first battery, is measured. Thereafter, the center nodes of both dividers are connected to each other and the center node voltage of both dividers is measured and compared to the first voltage obtained from the first divider. A difference between the two voltages indicates a leakage current from the second battery to ground.

DETAILED DESCRIPTION

Figure 1:
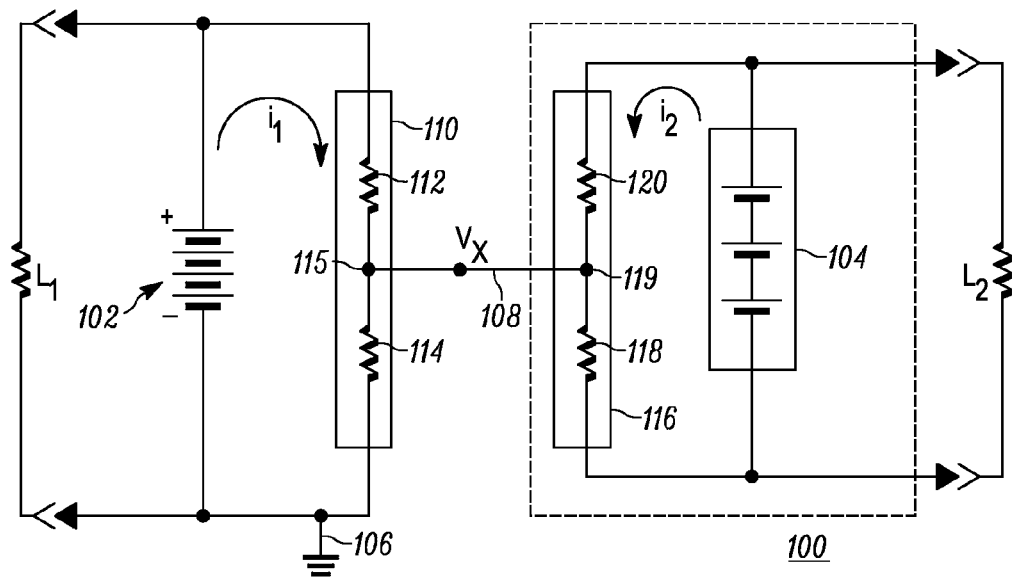
FIG. 1 is a diagram showing first and second battery packs of a vehicle each of which is shunted by a corresponding voltage divider.

FIG. 1 depicts a circuit 100 comprising two batteries, i.e., a first, low voltage battery 102 configured to be electrically connected to a first load, L1, typically vehicle accessories, and, a second, and high-voltage battery 104 is configured to be electrically connected to a second load, L2, such as an electric drive motor. L1 and L2 are normally isolated from each other. L2 also does not normally share the vehicle's ground or reference potential 106. The batteries 102, 104 comprise batteries found in many hybrid electric vehicles, not shown.

The high-voltage battery 104 actually comprises multiple, relatively low voltage batteries connected in series with each other. Vehicle wiring and electrical connections between the multiple batteries, necessary to connect multiple batteries together, create a likelihood or possibility that a fault or leakage current can develop between one or more of the series-connected batteries and the reference potential 106 for the vehicle.

The batteries 102, 104 are supposed to be electrically and physically isolated from each other. As shown in FIG. 1, however, the batteries 102, 104 can be provided an electrical connection 108 between them, which can be used to detect leakage current from one or more cells of the second battery 104 to ground.

The terminals of the first battery 102, normally about 12 volts, are connected to each other or "shunted" by a first voltage divider 110 comprising two, series-connected resistors 112 and 114 with a center node 115 between them. The first voltage divider 110 is connected across the positive and negative terminals of the first battery 102. The negative terminal of the first battery 102 is connected to the vehicle's ground potential 106.

The second battery 104, actually several batteries in series, is shunted by a second voltage divider 116. The second voltage divider 116 comprises two resistors 118 and 120, which are connected in series and thus share a center node 119 between them.

The center node 115 of the first divider 110 and the center node 119 of the second divider 116 are connected together by a wire or cable 108. Those of ordinary skill in the art will recognize that the first divider 110 connected across the first battery 102 defines a first loop, through which a first loop current, $i_1$ will flow. Similarly, the second divider 116 connected across the second battery 104 defines a second loop through which a second loop current $i_2$ will flow. As the circuit shown in FIG. 1 is drawn, however, no current flows through the connection 108 because the second loop does not share any connection with the first loop through which current can flow. If a connection is made between any of the individual batteries comprising the second battery and ground 106, a leakage current can flow between the two loops.

Figure 2:
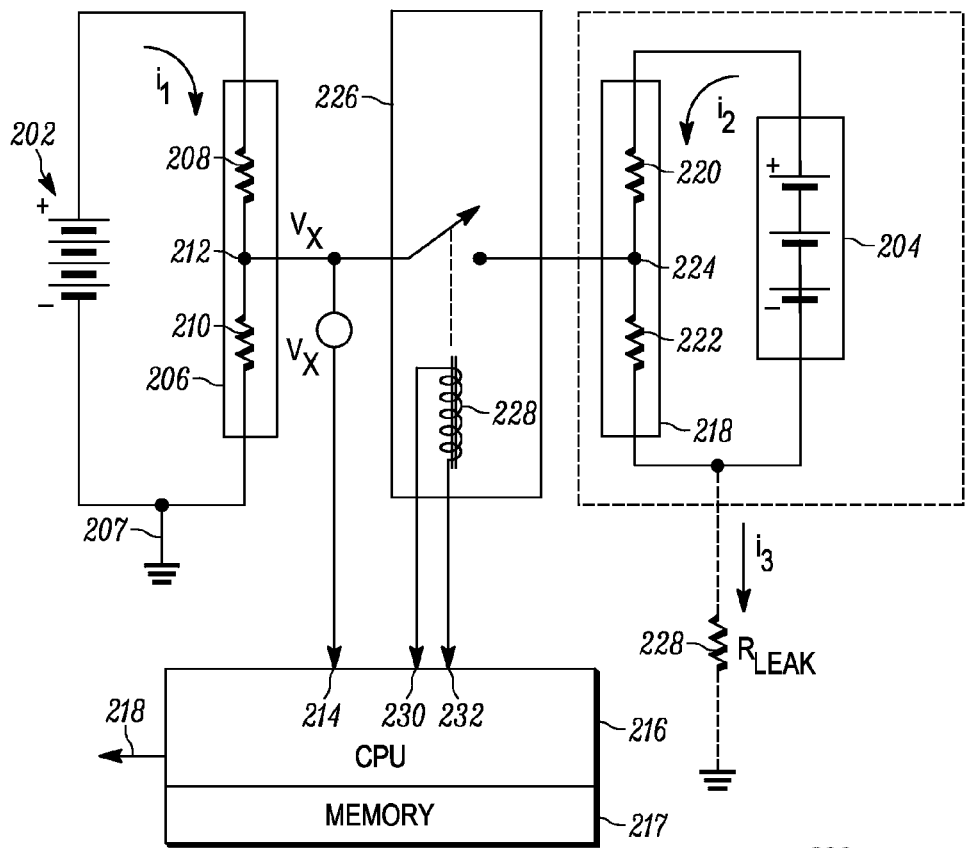
FIG. 2 depicts the battery pack of FIG. 1 but with a small leakage resistance between one battery pack and ground.

FIG. 2 depicts a circuit 200 for detecting leakage current between two batteries 202 and 204. Similar to the circuits shown in FIG. 1, a first, low-voltage battery 202 is shunted by a first voltage divider 206 comprising two resistors 208 and 210. The two resistors 208, 210 share a center node between them 212. The voltage at the center node 212, denominated as $v_x$ is provided to an input terminal 214 of a microcontroller 216. The input terminal 214 is coupled to an analog-to-digital converter, not shown, but which is part of the microcontroller 216. An output 218 of the microcontroller, which is referred to hereinafter as a processor 216, is provided to a vehicle's electronic control unit or ECU, not shown, for subsequent processing, not germane to this disclosure. The processor 216 is thus able to "read" the analog voltage at the center node of the first divider 206, convert it to a digital value, perform arithmetic operations on such digital values and provide the digital values to one or more other computers.

A second, high-voltage battery 204, comprising multiple batteries connected in series, is shunted by a second voltage divider 218 comprising two resistors 220 and 222. The second voltage divider has its own center node 224. The "second" center node 224 of the second divider 216 is "selectably" connected to the center node 212 of the first divider 206 via closure of a computer-controlled switch 226.

As shown in the figure, a leakage resistance, $R_{leak}$ 228, exists between the negative terminal of the second battery 204 and the vehicle ground potential 207, or from between one of the cells of the second battery 204, and ground potential 207. The leak resistance 228 thus represents a current leakage pathway between the first battery 202 and the second battery 204, which includes series-connected batteries comprising the second battery 204. Current flowing through a loop comprising the second battery 204, the second voltage divider 218, and the leakage resistor 226, produces a voltage drop at the center node 224 of the second voltage divider 218 due to the leakage current i3. The voltage at the center node 224 is connected to or "provided to" the center node 212 of the first voltage divider when the switch 226 is closed responsive to signals provided to a solenoid 228 comprised in the switch 226, the terminals of which are coupled to the processor 216 through two outputs 230, 232 of said processor 216.

Figure 3:
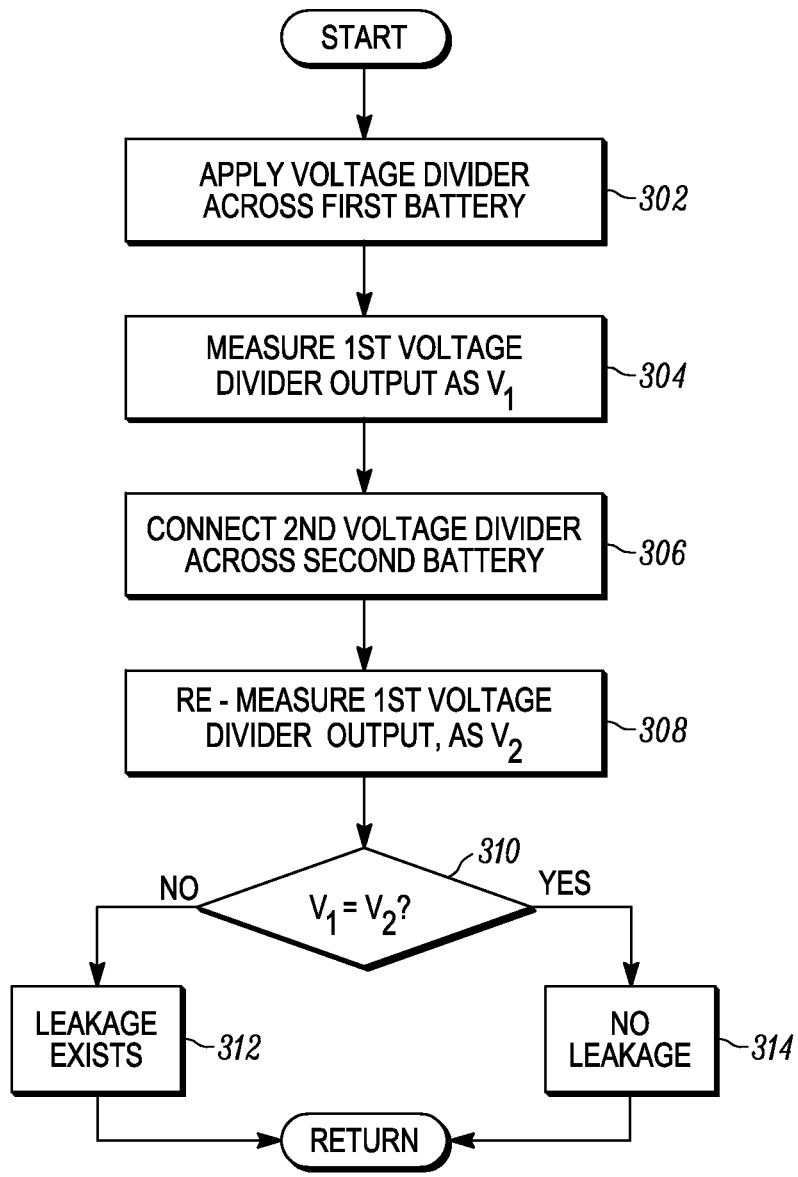
FIG. 3 depicts steps of a method for detecting leakage current between two battery sources.

FIG. 3 is a flowchart depicting steps of a method 300 for detecting leakage current between two power sources, such as the two batteries shown in FIG. 2. At a first step 302, a first voltage divider, such as the first voltage divider 206 shown in FIG. 2, is applied across a first battery, such as the first battery 202, also shown in FIG. 2. Those of ordinary skill in the art will of course recognize that such a voltage divider can be switched across the first battery and removed from the first battery using any appropriate switching device.

At step 304, a first voltage divider output voltage, $v_1$, measured at the center node of the voltage divider, is measured by a processor as an analog voltage. The analog voltage is preferably converted to a digital value by an analog-to-digital converter, comprised in the processor. Being in a digital format, the first voltage is preferably stored in a memory device at least temporarily, using a memory device such as a non-transitory memory device 217 coupled to the processor 216.

After that first voltage, $v_1$, is measured the third step 306 of the method 300 is to connect a second voltage divider, such as the second divider 218 shown in FIG. 2, across a second battery, such as the high-voltage battery 204, also shown in FIG. 2. At a fourth step 308, the center node of the second voltage divider is electrically connected to the center node of the first voltage divider followed by a second measurement of the voltage at the connected-together center nodes. The second voltage measurement is also converted to a digital format using the same apparatus and method by which the first voltage measured was converted to a digital format.

At step 310, it is determined whether the first measured voltage and the second measured voltage are equal. If the measured voltages are unequal, at step 312 it is assumed that a leakage current exists between the two batteries. Corrective action, if desired can then be taken. If no difference exists between the center node voltages, no leakage current exists, as shown in step 314. The method can thereafter be repeated, as desired.

The magnitude of the leakage current, $i_3$, can be determined. If a leakage current $i_3$ exists in the circuits shown in FIGS. 2, 4, and 5, connecting the center node 224 of the second voltage divider 218 to the center node 212 of the first voltage divider 206 will change the value of $v_x$. The magnitude of the leakage current, $i_3$, can therefore be determined by first measuring $v_x$ and calculating the value of $i_1$ while the switch between the first and second voltage dividers is open. By re-measuring $v_x$ with the switch closed, the value of $i_1$, can then be re-calculated. The magnitude of any increase or decrease in the value of $i_1$, with the switch closed relative to the value of $i_1$ with the switch open, corresponds to the value of the leakage current, $i_3$.

Those of ordinary skill in the art will recognize that the method depicted in FIG. 3 is performed by the processor 216, executing program instructions kept in a non-volatile memory device 217.

Figure 4:
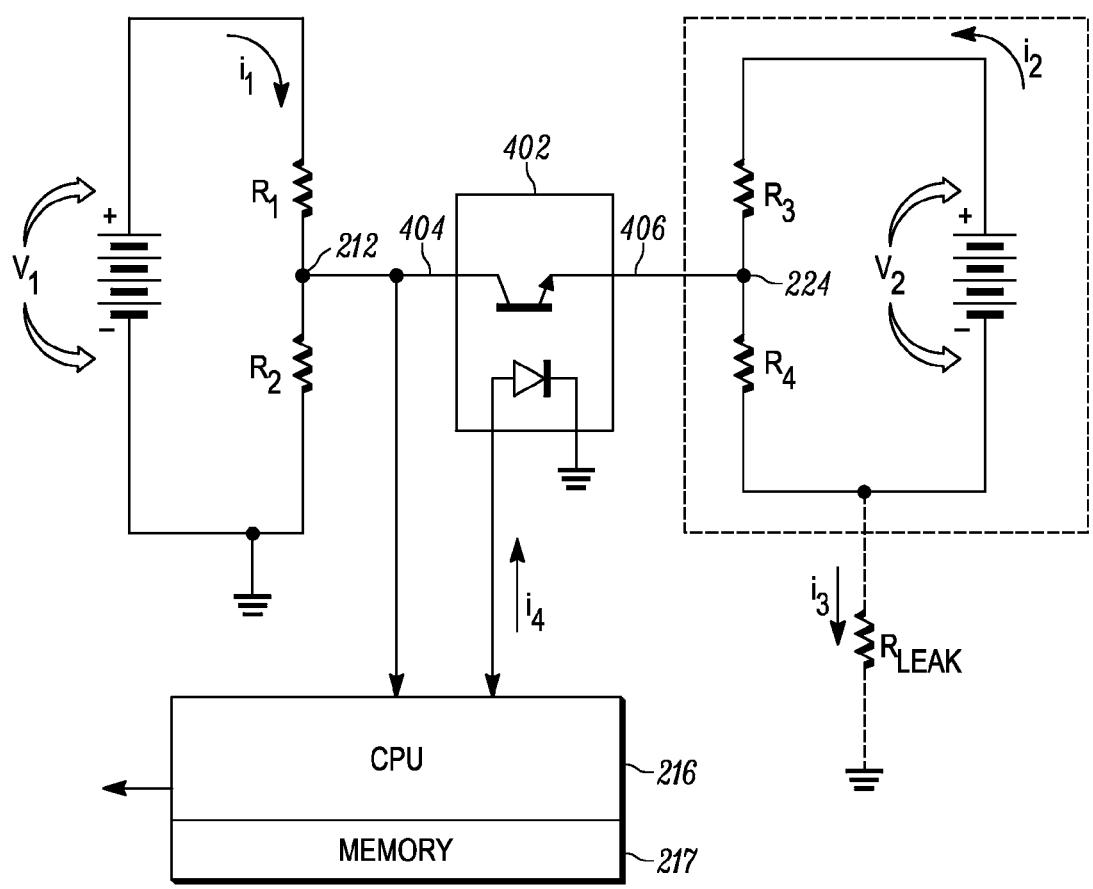
FIG. 4 depicts an alternate embodiment of an apparatus for detecting leakage current between two battery sources.

FIG. 4 depicts an alternate embodiment of an apparatus 400 for detecting leakage current between power sources. The circuit of FIG. 4 differs from that shown in FIG. 2 by the use of an optical isolator 402 to connect the two voltage divider center nodes. Those of ordinary skill in the art will recognize that the optical isolator 402 provides a non-mechanical, nearly-zero ohm connection between an input port 406 and an output port 404 responsive to a current i4 provided by a processor 416. The circuit shown in FIG. 2 and the circuit shown in FIG. 4 are otherwise identical.

Those of ordinary skill in the art will appreciate that connecting a voltage divider across a power source, such as a battery, solely to test for leakage current will inherently waste power during the time that the dividers are connected. The resistance values used for the voltage dividers will determine how much current is wasted, with larger resistance values being preferred over smaller values. In a preferred embodiment, the resistors used to form the voltage dividers are preferably the same value and preferably at least one million ohms. The voltage dividers will thus provide a voltage division factor of 2.

Figure 5:
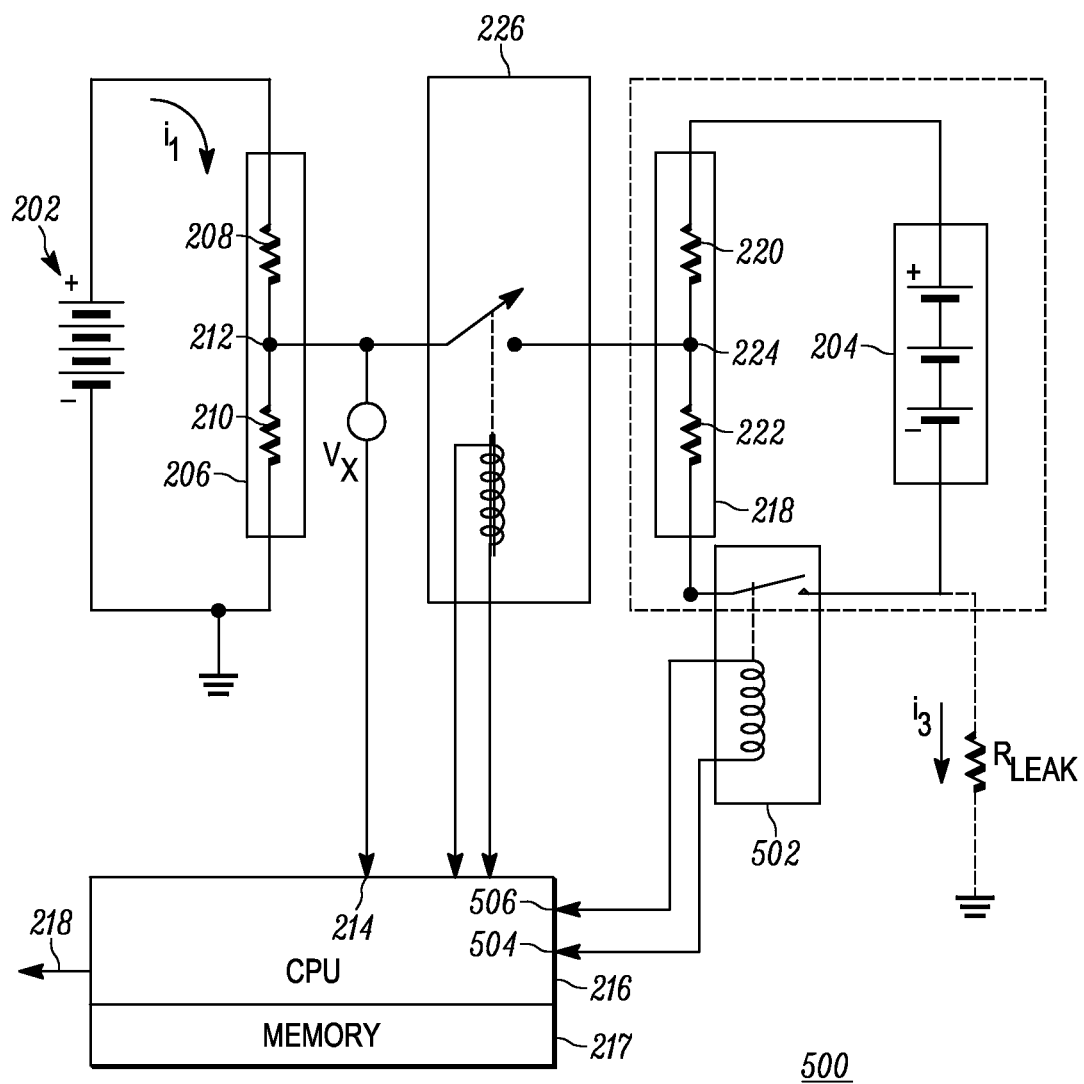
FIG. 5 depicts yet another embodiment of an apparatus for detecting leakage current between two batteries.

Current draw can be reduced further if the voltage dividers are selectably connected to the power sources/batteries, only when a leakage current measurement is wanted. FIG. 5 thus depicts another embodiment of an apparatus 500 for detecting leakage current, differing from FIG. 2 by the addition of an additional switch 502 between the second voltage divider 218 and the negative terminal of the second battery 204. The second switch 502 thus selectably connects the second voltage divider 218 responsive to signals from the processor 216, avoiding unnecessary power dissipation. Those of ordinary skill in the art will appreciate that the first voltage divider can also be selectably connected to the first battery 202 using a switch, such as the one shown in FIG. 5 or an optical isolator.

The foregoing description is for purposes of illustration only. The true scope of the invention is set forth in the following claims.

The invention claimed is:

1. A method of detecting a leakage current between two electrical energy sources in a vehicle, the method comprising:
   connecting a first voltage divider having a first center node, between the first power source and a reference potential for the vehicle;
   determining a first voltage at said first center node;
   connecting a second voltage divider having a second center node across the second power source;
   connecting the second center node and the first center node to each other;
   determining a second voltage at said first center node responsive to the connection of the second center node to the first center node, the second voltage being determined relative to the reference potential; and
   determining whether the first and second voltages are unequal;
   whereby unequal first and second voltages indicates a leakage current flowing from said second power source to at least one of the first power source and said reference potential.

2. The method of claim 1, wherein the first and second power sources are batteries.

3. The method of claim 2, wherein the two batteries have first and second different output voltages.

4. The method of claim 3, wherein the second battery comprises a plurality of batteries connect together in series.

5. The method of claim 2, wherein the second battery is configured to be electrically isolated from a ground potential but wherein a leakage current from said second battery flows from the second battery to said ground potential.

6. The method of claim 2, wherein the step of connecting a first voltage divider comprises connecting to the first battery, a voltage divider having a voltage division factor of about two.

7. The method of claim 1, wherein the step of determining whether the first and second voltages are unequal includes the steps of:
converting the first voltage to a first digital value;
converting the second voltage to a second digital value; and
computing a difference between the first digital value and the second digital value.

8. An apparatus for detecting a leakage current conducted between two electrical energy sources in a vehicle having a chassis, which carries a reference potential voltage, the apparatus comprising:
a first voltage divider having a first center node, the first voltage connected across a first, low-voltage power source and a reference potential for a vehicle;
a second voltage divider having a second center node, and which is connected across a second power source, which is electrically isolated from the first power source;
a switch, configured to provide a removable connection between the first center node and the second center node;
a processor, configured to be selectably coupled to the first center node when the switch is in a first position and coupled to the connection between the first center node and the second center node when the switch is in a second position, the processor being additionally configured to determine a first voltage when the switch is in the first position and determine a second voltage when the switch is in the second position and further configured to determine a difference between the first and second voltages.

9. The apparatus of claim 8, wherein the first power source is a first battery having positive and negative terminals, the negative terminal of which is connected to the vehicle chassis.

10. The apparatus of claim 9, wherein the second power source is a second battery comprising a plurality of separate cells.

11. The apparatus of claim 10, wherein the second battery has positive and negative terminals, both of which are isolated from the vehicle chassis during normal operation of said second battery.

12. The apparatus of claim 8, wherein the second voltage divider comprises first and second resistances, each resistance having a value of at least one million Ohms.

13. The apparatus of claim 8, wherein the first voltage divider comprises first and second resistances having values which are substantially equal to each other.

14. An apparatus for detecting a leakage current between two batteries in a vehicle, the apparatus comprising:
a processor;
a switch, operatively coupled to and controlled by the processor and operatively coupled between first and second voltage dividers, which are selectably attachable to the first and second batteries; and
a non-volatile memory device coupled to the processor and storing program instructions, which when executed cause the processor to:
connect the first voltage divider having a first center node, between the first battery and a reference potential for the vehicle;
determine a first voltage at said first center node;
connect the second voltage divider having a second center node across the second battery;
connect the second center node and the first center node to each other;
determine a second voltage at said first center node responsive to the connection of the second center node to the first center node through actuation of the switch, the second voltage being determined relative to the reference potential; and
determining whether the first and second voltages are unequal.

15. The apparatus of claim 14, wherein the program instructions cause the processor to identify unequal first and second voltages as indicative of a leakage current flowing from said second battery to at least one of the first battery and said reference potential.

* * * * *